United States Patent [19]

Kadowaki et al.

[11] Patent Number: 5,146,467
[45] Date of Patent: Sep. 8, 1992

[54] SEMICONDUCTOR LASER DEVICE

[75] Inventors: Tomoko Kadowaki; Takashi Murakami, both of Itami, Japan

[73] Assignee: Mitsubishi Denki Kabushiki Kaisha, Tokyo, Japan

[21] Appl. No.: 734,450

[22] Filed: Jul. 23, 1991

[30] Foreign Application Priority Data

Oct. 4, 1990 [JP] Japan .................. 2-268883

[51] Int. Cl.$^5$ .............................. H01S 3/19
[52] U.S. Cl. ........................ 372/46; 372/44; 372/45
[58] Field of Search ............... 372/44, 45, 46

[56] References Cited

U.S. PATENT DOCUMENTS

| 4,757,510 | 7/1988 | Kaneno et al. | 372/45 |
| 4,974,231 | 11/1990 | Gomyo | 372/45 |
| 5,042,043 | 8/1991 | Hatano et al. | 372/45 |
| 5,048,037 | 9/1991 | Arimoto et al. | 372/45 |

OTHER PUBLICATIONS

Tanaka et al., "Transverse-Mode-Stabilized Ridge Stripe AlGaInP Semiconductor Lasers Incorporating A Thin GaAs Etch-Stop Layer", Applied Physics Letters, vol. 54, No. 15, Apr. 1989, pp. 1391-1393.
Nitta et al., "Astigmatism in Ridge-Stripe InGaAlP Laser Diodes" Japanese Journal of Applied Physics, vol. 28, No. 11, Nov. 1989, pp. L2089-L2091.

Primary Examiner—John D. Lee
Assistant Examiner—Robert E. Wise
Attorney, Agent, or Firm—Leydig, Voit & Mayer

[57] ABSTRACT

A semiconductor laser device producing visible light includes a double heterojunction structure having a first conductivity type lower cladding layer, an active layer and a second conductivity type upper cladding layer, formed in a first epitaxial growth process of AlGaInP series materials and a contact layer formed in a second or later epitaxial growth process. The contact layer is $In_xGA_{1-x}AS_yP_{1-y}$ which can be grown at a lower temperature than used in the first process. Therefore, deterioration in laser characteristics due to the diffusion of dopant impurities during the growth of contact layer can be prevented, resulting in a semiconductor laser device having high performance and long lifetime.

14 Claims, 6 Drawing Sheets

SEMICONDUCTOR LASER DEVICE

FIELD OF THE INVENTION

The present invention relates to a semiconductor laser device producing visible light and having high performance and long lifetime.

BACKGROUND OF THE INVENTION

FIG. 5 is a cross-sectional view showing a structure of a visible light semiconductor laser. In FIG. 5, reference numeral 1 designates an n type GaAs substrate. A double-hetero-junction structure comprising an n type $(Al_{0.7}Ga_{0.3})_{0.5}In_{0.5}P$ lower cladding layer 2 of 1.0 micron thickness, an undoped $Ga_{0.5}In_{0.5}P$ active layer 3 of 0.08 micron thickness, and a p type $(Al_{0.7}Ga_{0.3})_{0.5}In_{0.5}P$ upper cladding layer 4 is disposed on the substrate 1. The upper cladding layer 4 has a stripe-shaped ridge part in a longitudinal direction, i.e., along the laser resonator, at the center portion of the laser in the width direction. The upper cladding layer 4, other than the ridge part, that is, the portion sandwiched by active layer 3 and current blocking layer 6, is 0.3 micron thick and the ridge part is 1.0 micron thick. A p type $Ga_{0.5}In_{0.5}P$ buffer layer 5 of 0.1 micron thickness is disposed on the ridge part of upper cladding layer 4. A p type GaAs cap layer 8a of 0.3 micron thickness is disposed on the buffer layer 5. An n type $In_tGa_{1-t}As_uP_{1-u}$ current blocking layer 6 of 1.1 microns thickness is disposed on the upper cladding layer 4, burying the ridge 11, which comprises the cap layer 8a, the buffer layer 5, and the ridge part of upper cladding layer 4, but not on the top surface of cap layer 8a. The width of the bottom of ridge 11 is 4 microns. A p type GaAs contact layer 8b of 3.0 microns thickness is disposed on the current blocking layer 6 and the cap layer 8a. A p side electrode 9 is disposed on the contact layer 8b and an n side electrode 10 is disposed on the rear surface of substrate 1.

This structure operates as follows.

When a forward direction voltage is applied between the p side electrode 9 and the n side electrode 10, current flows only through the ridge 11 because of the existence of current blocking layer 6. Since the lower cladding layer 2, the active layer 3 and the upper cladding layer 4 constitute a double-hetero-junction structure, a portion of active layer 3 in the vicinity of ridge 11 emits light because of the current injected through the ridge 11, resulting in laser oscillation.

A method for manufacturing the double-hetero-junction semiconductor laser of FIG. 5 is illustrated in figures 6(a) to 6(f). In these figures, the same elements are given the same reference numerals as in FIG. 5, and reference numeral 12 designates a silicon nitride (SiN) film.

As shown in FIG. 6(a), the n type $(Al_{0.7}Ga_{0.3})_{0.5}In_{0.5}P$ lower cladding layer 2, the undoped $Ga_{0.5}In_{0.5}P$ active layer 3, the p type $(Al_{0.7}Ga_{0.3})_{0.5}In_{0.5}P$ upper cladding layer 4, the p type $Ga_{0.5}In_{0.5}P$ buffer layer 5 and the p type GaAs cap layer 8a are successively grown on the n type GaAs substrate 1 by MOCVD (Metal Organic Chemical Vapor Deposition). A typical growth temperature is 650° to 700° C. AsH3 gas is introduced into the reactive tube while heating the GaAs substrate 1 in order to prevent thermal decomposition of substrate 1. When crystal growth starts, the supply of AsH3 gas is stopped and a dopant source gas for AlGaInP series semiconductors such as PH3, trimethylaluminum, triethylgallium, trimethylindium or the like are introduced. After the layers from lower cladding layer 2 to buffer layer 5 are grown, the supply of PH3, trimethylaluminum and trimethylindium is stopped and AsH3 is again introduced to grow the p type GaAs cap layer 8a.

Then, as shown in FIG. 6(b), the SiN film 12 of a stripe configuration is formed on the p type GaAs cap layer 8a. Thereafter, as shown in FIG. 6(c), the cap layer 8a, the buffer layer 5 and the upper cladding layer 4 are etched away using the SiN film 12 as a mask to form the ridge 11. Then, as shown in FIG. 6(d), the n type $In_tGa_{1-t}As_uP_{1-U}$ current blocking layer 6 is selectively grown using the SiN film 12 as a mask. While heating the substrate on which the ridge 11 is formed and growing the n type $In_tGa_{1-t}As_uP_{1-u}$ current blocking layer 6, PH3 gas is introduced to apply phosphorus pressure to the substrate, so that the $(Al_{0.7}Ga_{0.3})_{0.5}In_{0.5}P$ upper cladding layer 4 does not decompose. After the current blocking layer 6 is grown, the SiN film 12 is removed and the p type GaAs contact layer 8b is grown as shown in FIG. 6(e). During heating the substrate before the growth of p type GaAs contact layer 8b, PH3 gas is introduced to apply phosphorus pressure, so that the n type $In_tGa_{1-t}As_uP_{1-u}$ does not decompose. When the p type GaAs contact layer 8b starts growing, the supply of PH3 gas is stopped and triethylgallium and AsH3 gases are introduced to form the p type GaAs contact layer 8b. A typical growth temperature of the p type GaAs contact layer 8b is 650° to 700° C. In addition, Zn is used as the p type dopant source gas and diethylzinc (DEZn) is used as p type dopant source gas. The charge carrier density of the p type GaAs contact layer 8b is controlled by controlling the flow rate of DEZn. Finally, as shown in FIG. 6(f), the p side electrode 9 and the n side electrode 10 are deposited to complete the laser structure of FIG. 5.

In this visible light semiconductor laser device, p type GaAs is used for the contact layer 8b and this induces the following problems.

Since the p type GaAs contact layer 8b is thick, that is 3 microns, it about an hour to grow that. In addition, since the growth temperature is high as 650° to 700° C., the activation rate of dopant impurities in the cladding layer varies or the dopant atoms diffuse from the cladding layer into the active layer during the growth of p type GaAs contact layer, resulting in deterioration in laser characteristics. In order to reduce the deterioration, it is necessary to lower the growth temperature of contact layer 8b. Here, the charge carrier density of contact layer 8b is required to be approximately $10^{18}$ to $10^{19}$ cm$^{-3}$ by controlling the flow rate of DEZn, p type dopant source gas. However, when the p type GaAs is grown at a lower temperature, the introduction ratio of Zn as p type dopant into the p type GaAs must be higher, resulting in difficulty in controlling the charge carrier density. As a result, excess dopant impurity atoms enter into the contact layer and induces harmful influences such as crystalline defects. Accordingly, it is difficult to grow the GaAs contact layer at a low temperature.

Since the $In_tGa_{1-t}As_uP_{1-u}$ current blocking layer 6 occupies the large part of the wafer surface before the p type GaAs contact layer 8b is grown, PH3 gas is introduced while heating the substrate before the growth of p type GaAs contact layer 8b to apply phosphorus pressure, so that the $In_tGa_{1-t}As_uP_{1-u}$ does not decompose. On the other hand the contact layer comprises GaAs and the p type GaAs cap layer 8a having the same composition as the contact layer is disposed on the top surface of ridge 11. When the temperature rises in PH$_3$ atmosphere, arsenic escapes from the p type GaAs cap layer 8a and then crystalline defects are likely to be created in the cap layer 8a. Since the p type GaAs cap layer 8a at the top of ridge 11 is only 0.3 micron thick, the crystalline defects are produced not only in the cap layer 8a but also in the $(Al_{0.7}Ga_{0.3})_{0.5}In_{0.5}P$ upper cladding layer and the $Ga_{0.5}In_{0.5}P$ active layer. As a result, the lifetime of the laser is reduced.

SUMMARY OF THE INVENTION

The present invention is directed to solving the above-described problems and has for its object to provide a semiconductor laser producing visible light and having high performance and long lifetime.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with an aspect of the present invention, p type $In_xGa_{1-x}As_yP_{1-y}$ ($0 \leq y < 1$) is used for the contact layer which is grown in a second or later epitaxial growth process. Therefore, the contact layer can be grown at low temperature, resulting in a high performance and long-life semiconductor laser producing visible light.

DETAILED DESCRIPTION OF PREFERRED EMBODIMENTS

Figure 1:
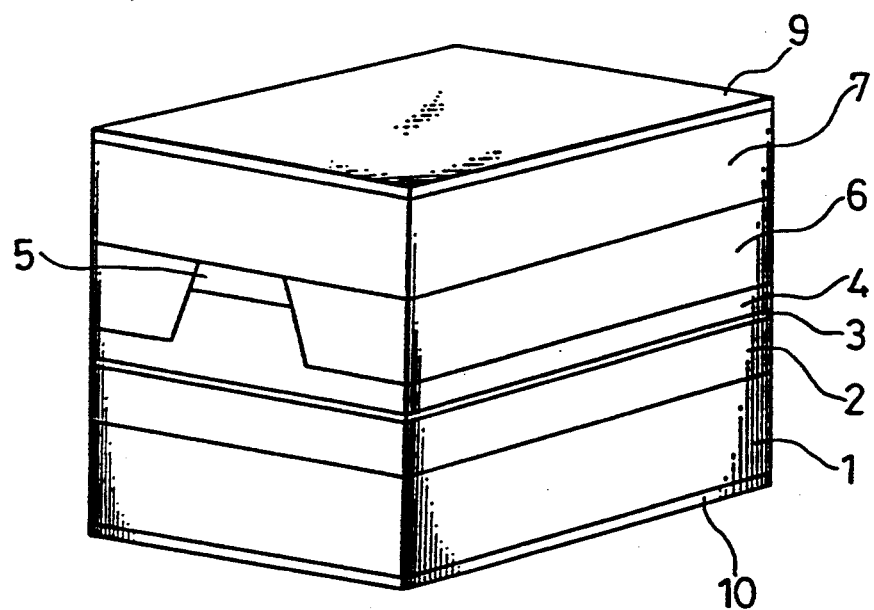
FIG. 1 is a perspective view of a semiconductor laser device in accordance with a first embodiment of the present invention.

A semiconductor laser device according to a first. embodiment of the present invention is shown in a perspective view of FIG. 1. In FIG. 1, reference numeral 1 designates an n type GaAs substrate. A double-heterojunction structure comprising an n type $(Al_{0.7}Ga_{0.3})_{0.5}In_{0.5}P$ lower cladding layer 2 of 1.0 micron thickness, an undoped $Ga_{0.5}In_{0.5}P$ active layer 3 of 0.08 micron thickness, and a p type $(Al_{0.7}Ga_{0.3})_{0.5}In_{0.5}P$ upper cladding layer 4 is disposed on the substrate 1. The upper cladding layer 4 has a stripe-shaped ridge part in a longitudinal direction, i.e., along the laser resonator, at the center portion of the laser in the width direction. The upper cladding layer 4 other than the ridge part, that is, the portion sandwiched by active layer 3 and current blocking layer 6, is 0.3 micron thick and the ridge part is 1.0 micron thick. A p type $Ga_{0.5}In_{0.5}P$ buffer layer 5 of 0.1 micron thickness is disposed on the ridge part of upper cladding layer 4. An n type $In_tGa_{1-t}As_uP_{1-u}$ current blocking layer 6 of 0.8 micron thickness is disposed on the upper cladding layer 4, burying the ridge 11, which comprises the buffer layer 5 and the ridge part of upper cladding layer 4, but not on the top surface of buffer layer 5. The width of the bottom of ridge part 11 is 4 microns. A p type $In_xGa_{1-x}As_yP_{1-y}$ contact layer 7 of 3 microns thickness is disposed on the current blocking layer 6 and the buffer layer 5. A p side electrode 9 is disposed on the contact layer 7 and an n side electrode 10 is disposed on the rear surface of substrate 1.

In this embodiment, as for the p type $In_xGa_{1-x}As_yP_{1-y}$ contact layer 7, p type $Ga_{0.5}In_{0.5}P$ (that is, x=0.5 and y =0) is used. Therefore, the p type $Ga_{0.5}In_{0.5}P$ buffer layer 5 also serves as the cap layer which is provided in the laser shown in FIG. 5.

Figure 5:
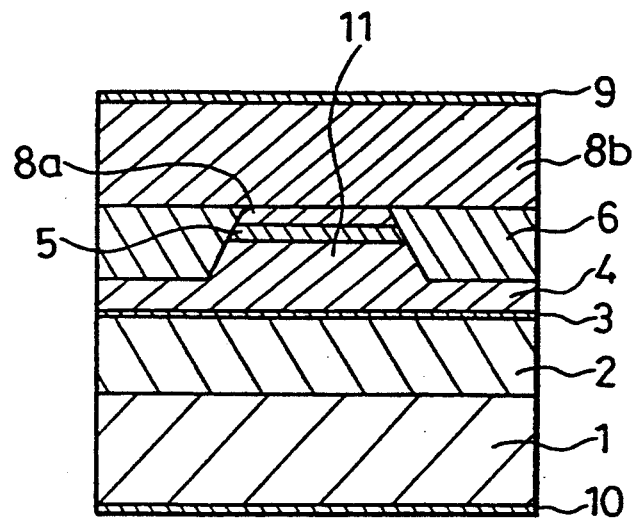
FIG. 5 is a cross-sectional view showing a prior art semiconductor laser device.
Figure 6A:
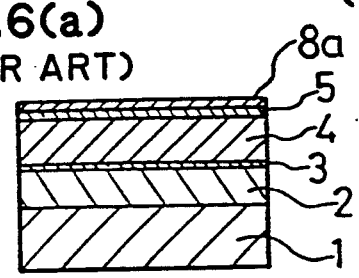
FIGS. 6(a) to 6(f) are cross-sectional views illustrating steps in a method for manufacturing the semiconductor laser device of FIG. 5.
Figure 6E:
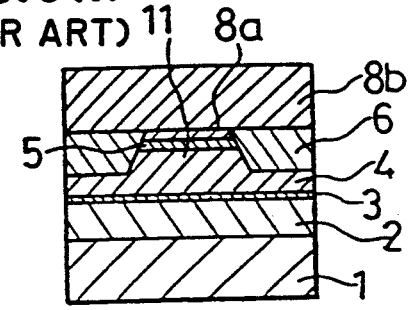
Figure 6B:
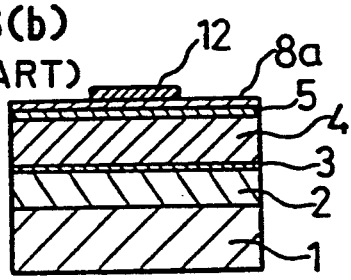
Figure 6F:
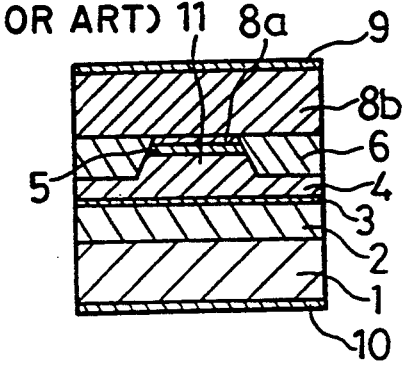
Figure 6C:
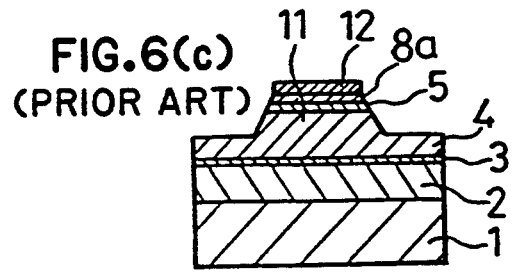
Figure 6D:
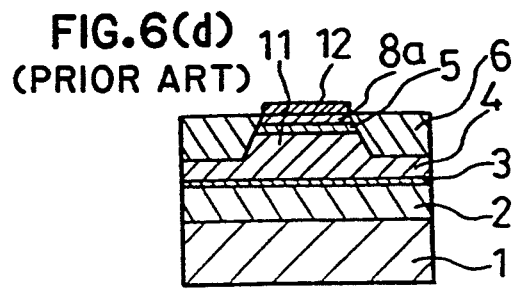

The operation of the laser of FIG. 1 is essentially the same as that of the laser of FIG. 5. When a forward direction voltage is applied between the p side electrode 9 and the n side electrode 10, current flow only through the ridge 11 because of the existence of current blocking layer 6. Since the lower cladding layer 2, the active layer 3 and the upper cladding layer 4 constitute a double-hetero-junction structure, a portion of active layer 3 in the vicinity of ridge 11 emits light because of the current injected through the ridge 11, resulting in laser oscillation.

A method for manufacturing the semiconductor laser device of FIG. 1 is illustrated in FIGS. 2(a) to 2(f). In these figures, the same elements are given the same reference numerals as in FIG. 1 and reference numeral 12 designates a silicon nitride (SiN) film.

Figure 2A:
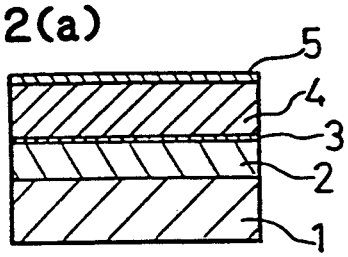
FIGS. 2(a) to 2(f) are cross-sectional views illustrating steps in a method for manufacturing the semiconductor laser device of FIG. 1.
Figure 2E:
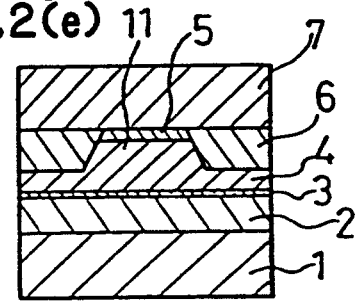
Figure 2B:
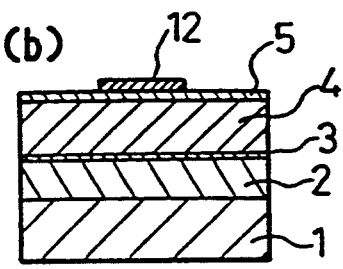

As shown in FIG. 2(a), the n type $(Al_{0.7}Ga_{0.3})_{0.5}In_{0.5}P$ lower cladding layer 2, the undoped $Ga_{0.5}In_{0.5}P$ active layer 3, the p type $(Al_{0.7}Ga_{0.3})_{0.5}In_{0.5}P$ upper cladding layer 4, the p type $Ga_{0.5}In_{0.5}P$ buffer layer 5 are successively grown on the n type GaAs substrate 1 by MOCVD. The buffer layer 5 also serves as the cap layer of the laser of FIG. 5. A typical growth temperature is 650° to 700 ° C. AsH$_3$ gas is introduced into the reaction tube to prevent thermal decomposition of substrate 1 while heating the GaAs substrate 1. When crystal growth starts, the supply of AsH$_3$ gas is stopped and a dopant source gas for of AlGaInP series semiconductors, such as PH$_3$, trimethylaluminum, triethylgallium, trimethylindium or the like is introduced. Then, as shown in FIG. 2(b), SiN film 12 of stripe configuration is formed on the p type $Ga_{0.5}In_{0.5}P$ buffer layer 5. Then, as shown in FIG. 2(c), the buffer layer 5 and the upper cladding layer 4 are etched away using the SiN film 12 as a mask to form the ridge 11. Then, as shown in FIG. 2(d), the n type $In_tGa_{1-t}As_uP_{1-u}$ current blocking layer 6 is selectively grown using the SiN film 12 as a mask. Thereafter, as shown in FIG. 2(e), the SiN film 12 is removed and the p type $In_xGa_{1-x}As_yP_{1-y}$ contact layer 7 is grown. Since the $In_tGa_{1-t}As_uP_{1-u}$ current blocking layer 6 occupies the large part of the wafer surface before the growth of contact layer 7, PH$_3$ gas is introduced to apply phosphor pressure to the wafer while heating the substrate before the growth of the contact layer. In the laser of FIG. 5, since the contact layer comprises GaAs and the cap layer at the top of the ridge also comprises GaAs, arsenic escapes from the GaAs cap layer into the PH$_3$ atmosphere and crystalline defects are likely to occur in the ridge. On the other hand, in this embodiment, since the contact layer comprises $Ga_{0.5}In_{0.5}P$ and the buffer layer at the top of the ridge also comprises $Ga_{0.5}In_{0.5}P$, crystalline defects are not likely to occur in the ridge in the $PH_3$ atmosphere. In addition, when p type $In_xGa_{1-x}As_yP_{1-y}$ is used, the contact layer having a desired charge carrier density can be obtained at a lower temperature than the typical growth temperature of 650° to 700° C. for the p type GaAs contact layer. As a result, deterioration in laser characteristics due to diffusion of dopant atoms into the cladding layer during the growth of contact layer can be prevented.

Figure 4:
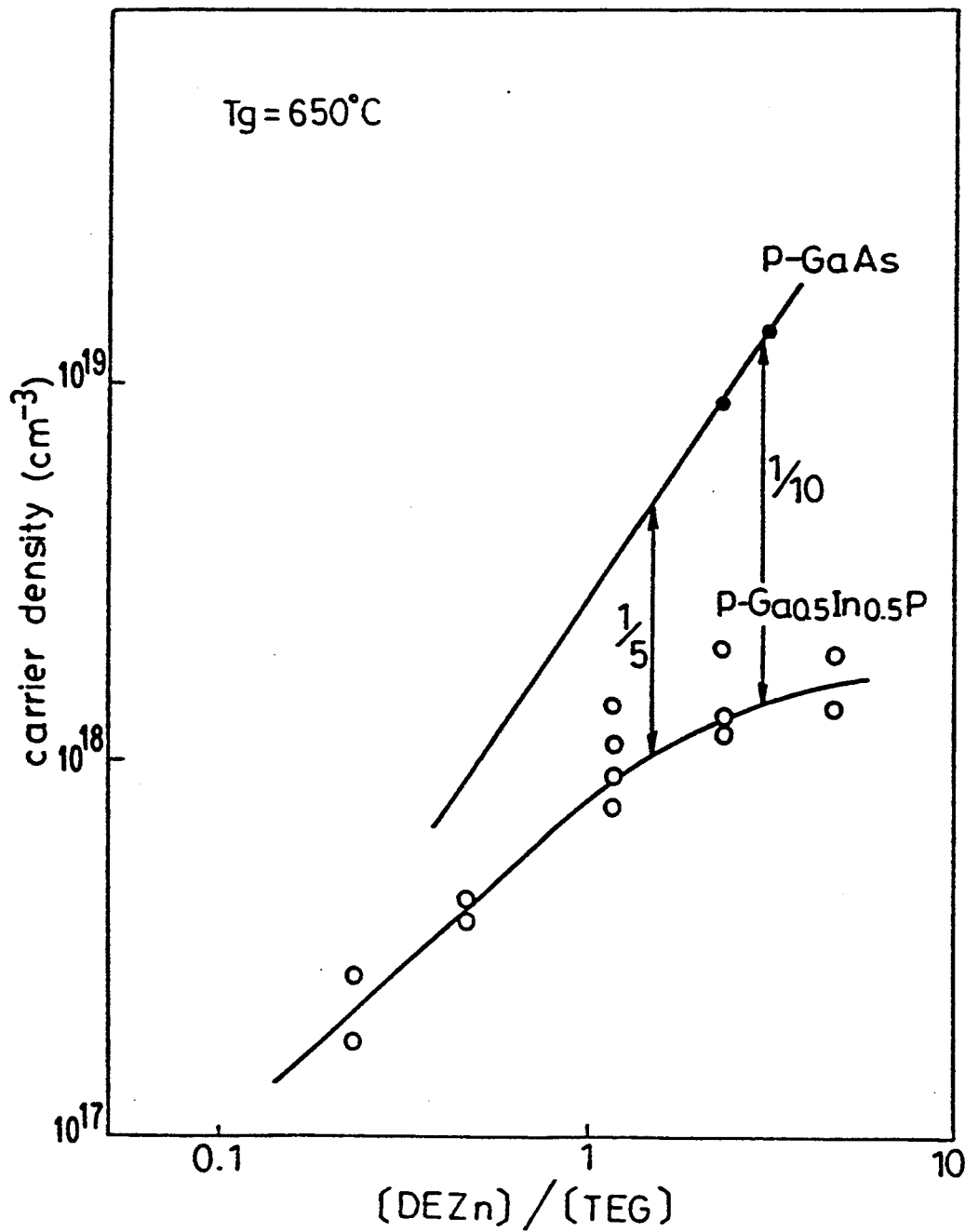
FIG. 4 is a diagram showing doping characteristics of Zn in p type GaAs and p type $Ga_{0.5}In_{0.5}P$ when the growth temperature (Tg) is 650° C.

The reason why the p type $In_xGa_{1-x}As_yP_{1-y}$ forms the contact layer having the desired charge carrier density at a lower temperature than the typical growth temperature of 650° to 700° C. for the p type GaAs contact layer, will be described hereinafter. FIG. 4 is a graph showing doping characteristics of Zn p type GaAs and p type $Ga_{0.5}In_{0.5}P$ when the growth temperature Tg is 650° C. As seen from FIG. 4, the introduction ratio of Zn into GaInP is 1/5 to 1/10 of the introduction ratio of Zn into GaAs when the carrier density is higher than $10^{18}$ cm$^{-3}$. When the growth temperature is lowered and the introduction ratio of Zn becomes high, in order to bring the carrier density close to $10^{18}$ to $10^{19}$ cm$^{-3}$ in GaAs, it is necessary to limit the flow rate of DEZn as a source of Zn to a value lower than a range which can be controlled by mass-flow controller, so that the carrier density cannot be controlled. On the other hand, the introduction ratio of Zn into the GaInP is quite low as compared with that into GaAs. Therefore, even if the growth temperature is lowered, the flow rate of DEZn required for obtaining a charge carrier density of $10^{18}$ to $10^{19}$ cm$^{-3}$ in GaInP is in a range which can be controlled by a mass-flow controller, so that the carrier density can be controlled.

In addition, the lowest limit temperature for growing $Ga_{0.5}In_{0.5}P$ is about 550° C. while that for growing GaAs is 600° C.

Figure 2F:
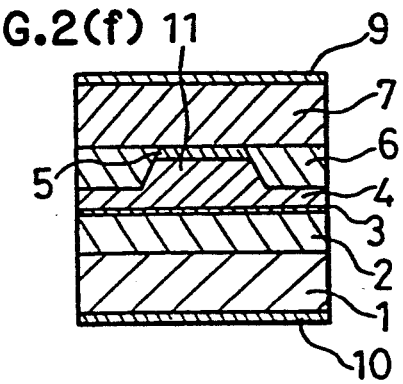
Figure 2C:
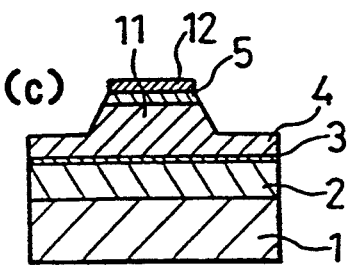
Figure 2D:
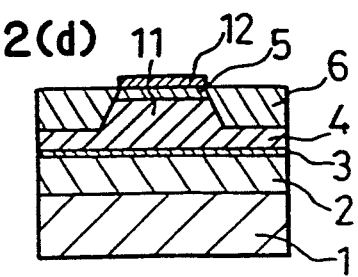

After the contact layer 7 is grown, as shown in figure 2(f), the p side electrode 9 and the n side electrode 10 are deposited to complete the laser structure of FIG. 1.

Although the active layer comprises $Ga_{0.5}In_{0.5}P$ in the above embodiment, the active layer can comprise $(Al_zGa_{1-z})_{0.5}In_{0.5}P$. In addition, although the cladding layer comprises $(Al_{0.7}Ga_{0.3})_{0.5}In_{0.5}P$ in the above embodiment, the cladding layer can comprise $(Al_wGa_{1-w})_{0.5}In_{0.5}P$ (z<w). Also in these cases, the same effects as described above can be obtained.

Figure 3:
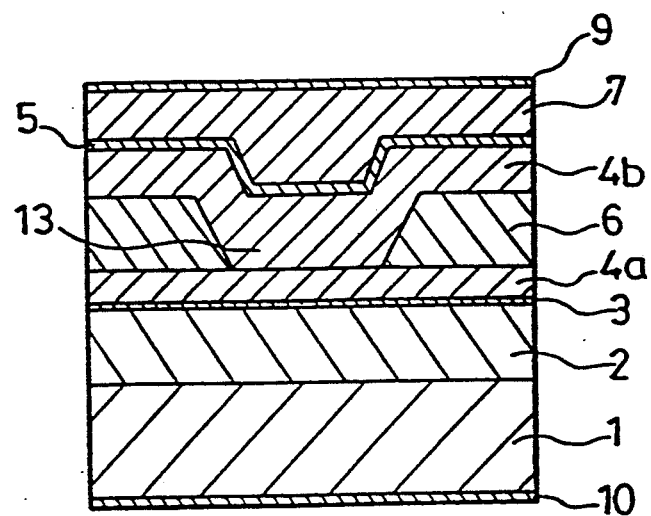
FIG. 3 is a cross-sectional view of a semiconductor laser in accordance with a second embodiment of the present invention.

A second embodiment of the present invention is shown in the cross-sectional view of FIG. 3. In FIG. 3, reference numeral 1 designates an n type GaAs substrate. A double-hetero-junction structure comprising an n type $(Al_{0.7}Ga_{0.3})_{0.5}In_{0.5}P$ lower cladding layer 2, an undoped $Ga_{0.5}In_{0.5}P$ active layer 3 and a p type $(Al_{0.7}Ga_{0.3})_{0.5}In_{0.5}P$ first upper cladding layer 4a is disposed on the substrate 1. An n type $In_tGa_{1-t}As_uP_{1-u}$ current blocking layer 6 having stripe-shaped groove 13 as a current path is disposed on the first upper cladding layer 4a. A p type $(Al_{0.7}Ga_{0.3})_{0.5}In_{0.5}P$ second upper cladding layer 4b is disposed on the current blocking layer 6, on the first upper cladding layer 4a exposed at the groove 13, and on the side walls of the groove 13. A p type $Ga_{0.5}In_{0.5}P$ buffer layer 5 is disposed on the second upper cladding layer 4b. A p type $In_xGa_{1-x}As_yP_{1-y}$ contact layer 7 is disposed on the buffer layer 5. A p side electrode 9 is disposed on the contact layer 7 and n side electrode 10 is disposed on the rear surface of substrate 1.

The thickness of the p type $(Al_{0.7}Ga_{0.3})_{0.5}In_{0.5}P$ first upper cladding layer 4a is approximately 0.3 micron, the thickness of p type $In_xGa_{1-x}As_yP_{1-y}$ contact layer 7 is approximately 3 microns and the width of the bottom of groove 13 is approximately 4 microns.

This structure operates as follows. When voltage is applied between the electrodes 9 and 10, current flows through the groove 13 and then a portion of active layer 3 below the groove 13 emits light, resulting in laser oscillation.

A method for manufacturing the structure of FIG. 3 will be described. The n type $(Al_{0.7}Ga_{0.3})_{0.5}In_{0.5}P$ lower cladding layer 2, the undoped $Ga_{0.5}In_{0.5}P$ active layer 3, the p type $(Al_{0.7}Ga_{0.3})_{0.5}In_{0.5}P$ first cladding layer 4a, the n type $In_tGa_{1-t}As_uP_{1-u}$ current blocking layer 6 are successively grown on the n type GaAs substrate 1. Thereafter, a portion of the n type $In_tGa_{1-t}As_uP_{1-u}$ current blocking layer 6 is etched away to form the groove 13. Then, the p type $(Al_{0.7}Ga_{0.3})_{0.5}In_{0.5}P$ second upper cladding layer 4b, the p type $Ga_{0.5}In_{0.5}P$ buffer layer 5 and the p type $In_xGa_{1-x}As_yP_{1-y}$ contact layer 7 are successively grown on the groove 13.

Also in this second embodiment, since the contact layer 7 comprises $In_xGa_{1-x}As_yP_{1-y}$, the contact layer can be grown at low temperature, resulting in a semiconductor laser device having high performance and long lifetime.

As is evident from the foregoing description, according to the present invention, p type $In_xGa_{1-x}As_yP_{1-y}$ is used for the contact layer which is grown in a second or later epitaxial growth process. Therefore, the contact layer can be grown at low a temperature and deterioration in laser characteristics due to the diffusion of dopant impurities during the growth of contact layer can be prevented. As a result, a semiconductor laser device producing visible light, having high performance and long lifetime can be realized.

What is claimed is:

1. A semiconductor laser device producing visible light comprising:
   a semiconductor substrate;
   a double heterojunction structure disposed on said semiconductor substrate and comprising a first conductivity type lower cladding layer, an active layer, and a second conductivity type upper cladding layer, said second cladding layer including a ridge having an upper surface and side walls;
   a first conductivity type semiconductor current blocking layer disposed on said upper cladding layer adjacent and contacting said side walls of said ridge for confining current flow to a portion of said active layer;
   a second conductivity type contact layer in electrical contact with said upper surface of said ridge of said second cladding layer comprising $In_xGas_{1-x}P$; and
   first and second electrodes contacting said semiconductor substrate and said contact layer, respectively.

2. The semiconductor laser device of claim 1 wherein said substrate is GaAs.

3. The semiconductor laser device of claim 2 wherein said active layer comprises $(Al_zGa_{1-z})_{0.5}In_{0.5}P$ and said upper and lower cladding layer comprise $(Al_wGa_{1-w})_{0.5}In_{0.5}P$ (z≧0, z>w).

4. The semiconductor laser device of claim 3 wherein said substrate comprises n type GaAs and said lower cladding layer comprises n type $(Al_wGa_{1-w})_{0.5}In_{0.5}P$ and said upper cladding layer comprises p type $(Al_wGa_{1-w})_{0.5}In_{0.5}P$.

5. The semiconductor laser device of claim 4 wherein said upper cladding layer contains Zn as a p type dopant impurity.

6. The semiconductor laser device of claim 5 wherein the temperature at which said contact layer is grown is lower than 650° C.

7. The semiconductor laser of claim 5 wherein said contact layer has a charge carrier density of least $10^{18}$ cm$^{-3}$.

8. The semiconductor laser of claim 1 wherein the ridge includes a buffer layer of $Ga_{0.5}In_{0.5}P$ disposed between and contacting the second cladding layer and the contact layer.

9. A semiconductor laser producing visible light comprising:
 a first conductivity type GaAs substrate;
 a double heterojunction structure including a first conductivity type $(Al_wGa_{1-w})_{0.5}In_{0.5}P$ first cladding layer disposed on the substrate, an $(Al_zGa_{1-z})_{0.5}In_{0.5}P$ active layer disposed on the first cladding layer, a second conductivity type $(Al_wGa_{1-w})_{0.5}In_{0.5}P$ second cladding layer disposed on the active layer, where $z \geq 0.2 > z$;
 a second conductivity type $In_xGa_{1-x}P$ contact layer in electrical contact with the second cladding layer; and
 first and second electrodes respectively contacting the substrate and contact layer.

10. The semiconductor laser of claim 9 including a $Ga_{0.5}In_{0.5}P$ second conductivity type buffer layer disposed between and contacting the second cladding layer and the contact layer.

11. The semiconductor laser of claim 9 wherein the second cladding layer includes a ridge structure including a ridge having an upper surface and side walls and including a first conductivity type $In_tGa_{1-t}As_uP_{1-u}$ current blocking layer disposed between the second cladding layer and the contact layer and contacting the side walls of the ridge structure.

12. The semiconductor laser of claim 9 including a first conductivity type $In_tGa_{1-t}As_uP_{1-u}$ current blocking layer disposed within parts of the second cladding layer for confining current flow to a portion of the active layer.

13. The semiconductor laser of claim 9 wherein the contact layer is p-type and contains zinc as a dopant impurity producing the p-type conductivity.

14. The semiconductor laser of claim 13 wherein the contact layer has a charge carrier density of at least $10^{18}$ cm$^{-3}$.

* * * * *

UNITED STATES PATENT AND TRADEMARK OFFICE
CERTIFICATE OF CORRECTION

PATENT NO. : 5,146,467

DATED : September 8, 1992

INVENTOR(S) : Kadowaki et al.

It is certified that error appears in the above-identified patent and that said Letters Patent is hereby corrected as shown below:

Claim 9, column 7, line 28, change "$z \geq 0, 2 > z$" to --$z \geq 0, w > z$--.

Signed and Sealed this

Ninth Day of November, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,146,467
DATED : September 8, 1992
INVENTOR(S) : Kadowaki et al.

It is certified that error appears in the above-indentified patent and that said Letters Patent is hereby corrected as shown below:

Claim 1, col. 6, line 57, change "$In x Ga_{1-x} P$" to --$In_x Ga_{1-x} P$--

Signed and Sealed this

Twelfth Day of April, 1994

Attest:

BRUCE LEHMAN

*Attesting Officer*

*Commissioner of Patents and Trademarks*